United States Patent
Saranathan et al.

(10) Patent No.: US 6,889,071 B2
(45) Date of Patent: May 3, 2005

(54) ACQUISITION OF HIGH-TEMPORAL FREE-BREATHING MR IMAGES

(75) Inventors: Manojkumar Saranathan, Rockville, MD (US); Thomas K. F. Foo, Rockville, MD (US); J. Andrew Derbyshire, Baltimore, MD (US)

(73) Assignee: General Electric Company, Milwaukee, WI (US)

( * ) Notice: Subject to any disclaimer, the term of this patent is extended or adjusted under 35 U.S.C. 154(b) by 469 days.

(21) Appl. No.: 09/681,068

(22) Filed: Dec. 19, 2000

(65) Prior Publication Data

US 2002/0077538 A1 Jun. 20, 2002

(51) Int. Cl.[7] .............................................. A61B 5/05
(52) U.S. Cl. ...................................... 600/413; 600/410
(58) Field of Search ................................ 600/413, 410, 600/407, 412; 324/307, 308, 309

(56) References Cited

U.S. PATENT DOCUMENTS

| | | | | |
|---|---|---|---|---|
| 5,251,628 A | * | 10/1993 | Foo ............................. | 600/413 |
| 5,377,680 A | | 1/1995 | Bernstein et al. | |
| 5,697,370 A | * | 12/1997 | Pelc et al. .................. | 600/410 |
| 6,070,097 A | * | 5/2000 | Kreger et al. ............... | 600/521 |
| 6,078,175 A | * | 6/2000 | Foo ............................. | 324/306 |
| 6,171,241 B1 | * | 1/2001 | McVeigh et al. ........... | 600/410 |
| 6,198,959 B1 | * | 3/2001 | Wang ........................... | 600/413 |
| 6,526,307 B2 | * | 2/2003 | Foo ............................. | 600/413 |

OTHER PUBLICATIONS van Dijk P. Direct cardiac NMR imaging of heart wall and blood flow velocity. J comput Assist Tomogr 1984; 429–36.
Walker MF, Souza SP, and Dumoulin CL. Quantitive flow measurement in phase contrast MR angiography. J Comput Assist Tomogr 1988; 12: 304–13.
Dumoulin CL, Souza SP, Walker MF, and Wagle W. Three Dimensional phase contrast angiography. Magn Reson Med 1989; 9: 139–49.
MacFall JR, Pelc NJ, and Vavrek RM. Correction of spatially dependent phase shifts for partial Fourier imaging. Magn Reson Imaging 1988; 6: 143–55.
Haacke EM, Liang ZP, and Izen SH. Constrained reconstruction: a superresolution, optimal signal–to–noise alternative to the Fourier transform in magnetic resonance imaging. Med Phys 1989; 16: 388–97.
Noll DC Nishimura DG, and Macovski A. Homodyne detection in magnetic resonance imaging. IEEE Trans. Med. Imaging 1991; 10: 154–163.
Lin W, Haacke EM, and Smith AS. Lumen definition in MR angiography. J Magn Reson Imaging 1991; 1: 327–36.
Hundley GW et al., Circulation, 1999, 100: 1697–1702.
Saranathan M et al. ISMRM abstract (submitted for the 2000 meeting).
Lenz, G. et al., "Retrospective Cardiac Gating: A Review of Technical Aspects and Future Directions", 1989, Magnetic Resonance Imaging, vol. 7, pp. 445–455.
Hundley, W. G. et al., "Utility of Fast Cine Magnetic Resonance Imaging and Display for the Detection of Myocardial Ischemia in Patients Not Well Suited for Second Harmonic Stress Echocardiography", 1999, vol. 100, pp. 1697–1702.

* cited by examiner

*Primary Examiner*—Daniel Robinson
(74) *Attorney, Agent, or Firm*—Ziolkowski Patent Solutions Group, LLC; Michael A. Della Penn; Carl B. Horton

(57) ABSTRACT

A system and method are disclosed to acquire high temporal resolution free-breathing cardiac MR images. The technique includes monitoring heart rate of a patient just prior to image acquisition to acquire a time period of an R—R interval, and using this time period from the heart rate monitoring to prospectively estimate future R—R intervals. The acquisition of MR data can then commence at any point in an R—R interval and extend for the time period recorded. The data acquisition can be segmented and acquired in successive R—R intervals, then combined to create high temporal resolution images.

32 Claims, 3 Drawing Sheets

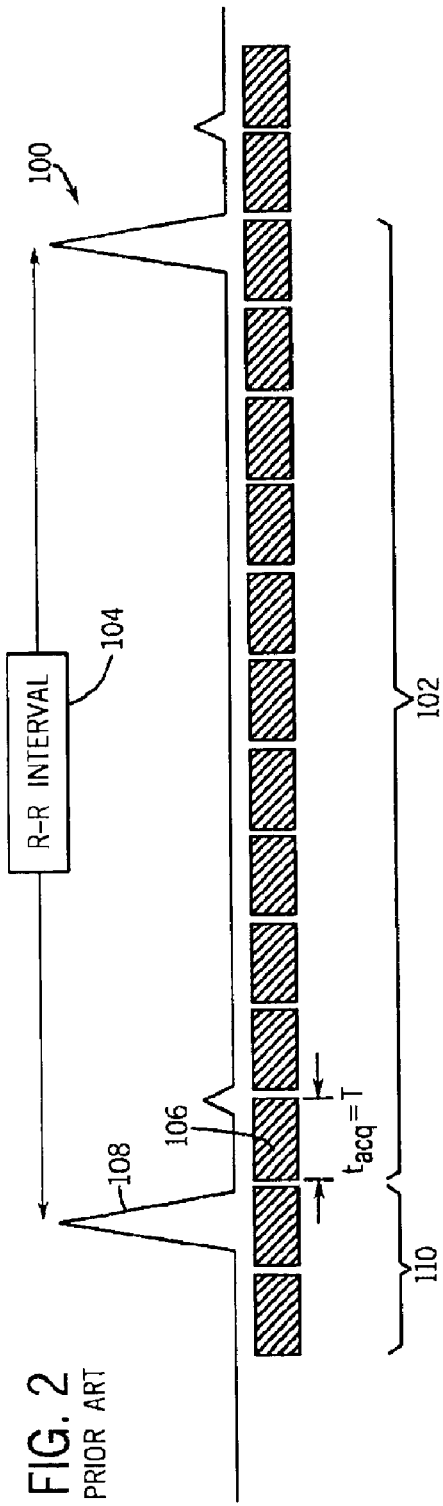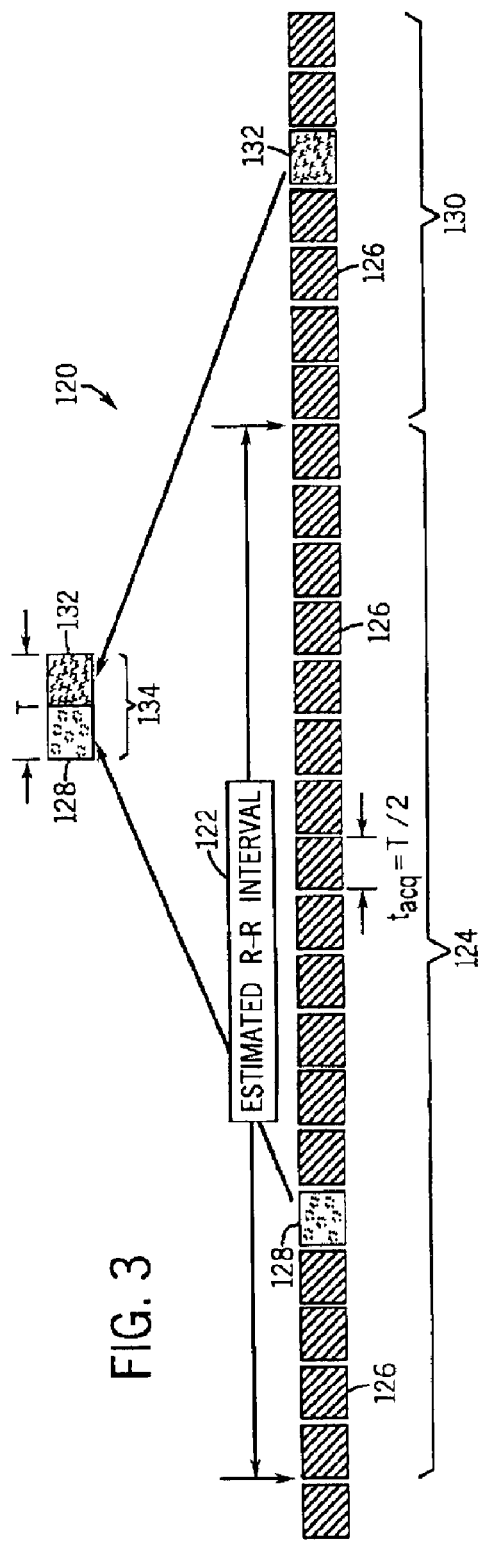
FIG. 2
PRIOR ART
FIG. 3

ACQUISITION OF HIGH-TEMPORAL FREE-BREATHING MR IMAGES

BACKGROUND OF INVENTION

The present invention relates generally to an improved method for acquiring magnetic resonance images (MRI), and more particularly, to a method and apparatus to acquire high temporal resolution MR images that is particularly useful in cardiovascular MR examinations.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or longitudinal magnetization, $M_z$, may be rotated, or tipped, into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Moving objects are particularly difficult to image, especially if an imaging plane is set in space with the object moving in and out of the imaging plane. Such imaging is especially difficult when a second periodic motion is added thereto. For example, imaging of objects in a subject which is breathing causes a periodic motion of internal structures, which is also further complicated by the beating motion of the heart if the structure is near the heart.

Cardiovascular disease is the leading cause of morbidity and mortality in most industrialized nations today. Until recently, cardiac MR imaging methods have been of limited clinical value for several reasons. First, such methods had a relatively long acquisition time relative to the cardiac cycle which resulted in cardiac motion blurring. Second, the long duration of the imaging scan requires patients to hold their breath for unreasonably long periods to avoid motion artifacts due to respiratory motion. With the advent of segmented k-space fast gradient recalled echo (fgre) based sequences and, more recently, echo-planar imaging-based sequences, cardiac MR imaging has become more commonplace.

Segmented k-space methods acquire data over several cardiac cycles in a single breath-held acquisition. Data is partitioned into several segments, with each segment acquired in successive R—R intervals. Within any given R—R interval, the same segment is repeatedly acquired at different time points within the R—R interval resulting in a movie of images covering the entire R—R interval, yet having a high temporal resolution. The development of interleaved echo planar imaging (also known as echo-train, or fast gradient recalled echo-train (fgret)) imaging methods has significantly reduced the required imaging scan times by permitting the collection of multiple k-space lines from each RF excitation (ETL). Roughly, either the acquisition time can be reduced by a factor of the ETL, thereby maintaining the same temporal resolution, or the temporal resolution can be increased by a factor of the ETL, thereby maintaining the same scan time. Typical breath-holding times are 12 to 16 seconds for fgre-based acquisitions and 6–8 seconds for fgret-based acquisitions. The combined use of echo-train techniques with the segmented k-space acquisition allows for cardiovascular examinations to be performed using breath-hold techniques.

An example of such an examination is the MR-based exercise or pharmacologically-induced stress function examination which is an MR version of an electrocardiograph (ECG) based stress test. In stress function imaging studies, the patient is subjected to successively increasing levels of cardiac stress and once the heart rate has stabilized at the required stress level, MR images are obtained typically using breath-held, segmented k-space techniques.

However, during the transition time between the successive stress levels there is a need to continuously monitor the patient for any abnormal cardiac function such as cardiac wall motion changes or ischemic-related cardiac events. While monitoring can be performed using the aforementioned breath-held technique, repeated breath-holding can be very exhausting for this class of patients. Therefore, there is a need for a fast MR acquisition method that can be used for monitoring during the transition periods between the successive stress levels. Such a method must be able to acquire free-breathing images with sufficient spatial and temporal resolution to detect cardiac wall motion abnormalities related to ischemic events in near real-time. The high temporal resolution requirements is particularly important during a stress test when the cardiac cycle (R—R interval time) is significantly reduced due to the high heart rates encountered at higher stress levels. Typically, approximately 10 images per R—R interval are adequate to visualize the systolic phase. The spatial resolution requirement is approximately 3 mm, or better to detect wall motion abnormalities.

ECG-gating poses yet another obstacle. Such gating suffers from a number of problems such as operator dependence, inter-patient variability, detached ECG leads, and corruption of ECG signals due to noise from the imaging gradients. In situations where ECG-gating is problematic, one alternative is to use peripheral gating which is less complex and often more reliable than ECG-gating. However, peripheral gating suffers from the limitation of introducing a delay relative to the ECG-gating, so it is not possible to identify the exact moment of the cardiac R-wave. More generally, it would be desirable to have a technique which avoids having to detect any gating triggers in real-time.

One potential solution to this problem is MR fluoroscopy which employs an ungated fast imaging sequence, such as an interleaved EPI fgret, to acquire, reconstruct, and display data in real-time. Although MR fluoroscopy appears to be an appealing solution, computational requirements for rapid image reconstruction and display, together with spatial resolution requirements, restricts the maximum achievable frame rates to 12–15 frames per second which result in a temporal resolution of 66–85 ms. Such resolutions are unacceptable for heart rates of the order of 150–180 beats per minute (bpm) to effectively visualize the systolic phase. Another possible solution is to use a segmented k-space CINE sequence with a small views-per-segment (VSP) value. However, this still poses a problem in that it requires a large number of heartbeats to complete an acquisition, during which breathing artifacts can be significant. Therefore, this is also not a desirable solution to the problem.

SUMMARY OF INVENTION

The present invention relates to a system and method for acquiring high temporal resolution, free-breathing cardiac MR images that solves the aforementioned problems.

The invention uses a measure of the heart rate, which can either be entered by the user or directly obtained from the ECG or peripheral leads, as a prospective estimate for future R—R intervals. Data is acquired from an arbitrary point in the R—R interval rather than from the onset of an R-wave.

The invention includes segmenting k-space acquisition to permit cardiovascular examinations which were previously not feasible due to the requirements of high temporal resolution and a short total acquisition time. The invention provides an examination using MR-based stress functions, which is an MR version of the widely-used ECG-based stress test. The patient is first subjected to successively increasing levels of cardiac stress leading to increased heart rates. Stress can be induced either by physical exercise or by the administration of a pharmaceutical, such as dobutamine. Once the heart rate has stabilized for a given stress level, the R—R interval is measured and recorded using standard ECG equipment or peripheral pulse gating equipment. Once recorded, the ECG reading is disregarded by the MR scanner, and an MR scan is commenced in which MR data is acquired using the recorded R—R interval as a time period for acquisition irrespective of the start or end of the actual R—R interval. Data acquisition for the current segment continues as in a segmented CINE acquisition until the end of the expected R—R interval time is reached. The k-space views are updated for the next segment and the process continues until all data have been acquired. Image reconstruction and display commences when all data necessary to reconstruct the CINE data set have been acquired. By segmenting data and acquiring different segments and successive acquisitions, higher resolution images can be achieved.

This method uses a virtual cardiac trigger by estimating an occurrence of the end of a cardiac cycle by the measurement of the cardiac cycle time immediately prior to the start of scan. In this manner, it is not necessary to actually wait for an ECG or peripheral gate trigger to complete a fast segmented k-space CINE scan with high temporal resolution. If an adequate ECG-trigger exists during scanning or if peripheral pulse gating is used, the MR scanner may update the cardiac interval time periodically during the continuous acquisition. This updating of the cardiac cycle or interval time can be automated or be placed under manual, operator control.

In accordance with one aspect of the invention, a method of acquiring free-breathing MR images includes monitoring heart rate of a subject just prior to image acquisition to acquire a time period of an R—R interval, and recording that time period from the heart rate monitoring to prospectively estimate future R—R intervals. The method next includes acquiring n sets of MR data, where the first MR data acquisition is commenced at any point in an R—R interval and extends for the time period recorded.

In accordance with another aspect of the invention, an MRI apparatus to acquire high temporal resolution images includes a magnetic resonance imaging system having an RF transceiver system and a plurality of gradient coils positioned about the bore of a magnet to impress a polarizing magnetic field. An RF switch is controlled by a pulse module to transmit RF signals to an RF coil assembly to acquire MR images. A computer is programmed to monitor heart rate of a patient, acquire a time period of an R—R interval of the heart rate, and store the time period of the R—R interval. The computer is also programmed to enable the MRI system and begin an MR scan of the patient at an arbitrary time in the R—R interval and continue the acquisition for a time comparable to the time period stored. An MR image can then be reconstructed with the MR data acquired over at least one R—R interval as estimated by the time period stored.

Yet another aspect of the invention includes a computer program having a set of instructions which, when executed by a computer, cause the computer to receive a time period signal indicative of an R—R interval representing a cardiac cycle of a patient, and acquire a first set of partial MR image data during a first acquisition period equal to the R—R interval. A second set of partial MR image data is then acquired during a second acquisition period equal to the R—R interval, and then an MR image can be reconstructed by combining the first and second sets of partial MR image data.

Since no physiological triggering is required with this approach, the pulse sequence does not need to be synchronized to the starting phase of the cardiac contraction cycle. This eliminates the need of attempting to acquire an ECG waveform and gate image acquisition to the R—R interval of the ECG waveform. Since the ECG waveforms, or the signals acquired from the ECG, can be distorted by the application of magnetic gradients, the probability of inaccurate gating, and the blurred images that can result therefrom, is eliminated.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings:

FIG. 2 is a prior art timing diagram of a data acquisition sequence.

FIG. 3 is a timing diagram of a data acquisition sequence according to the present invention.

DETAILED DESCRIPTION

Figure 1:
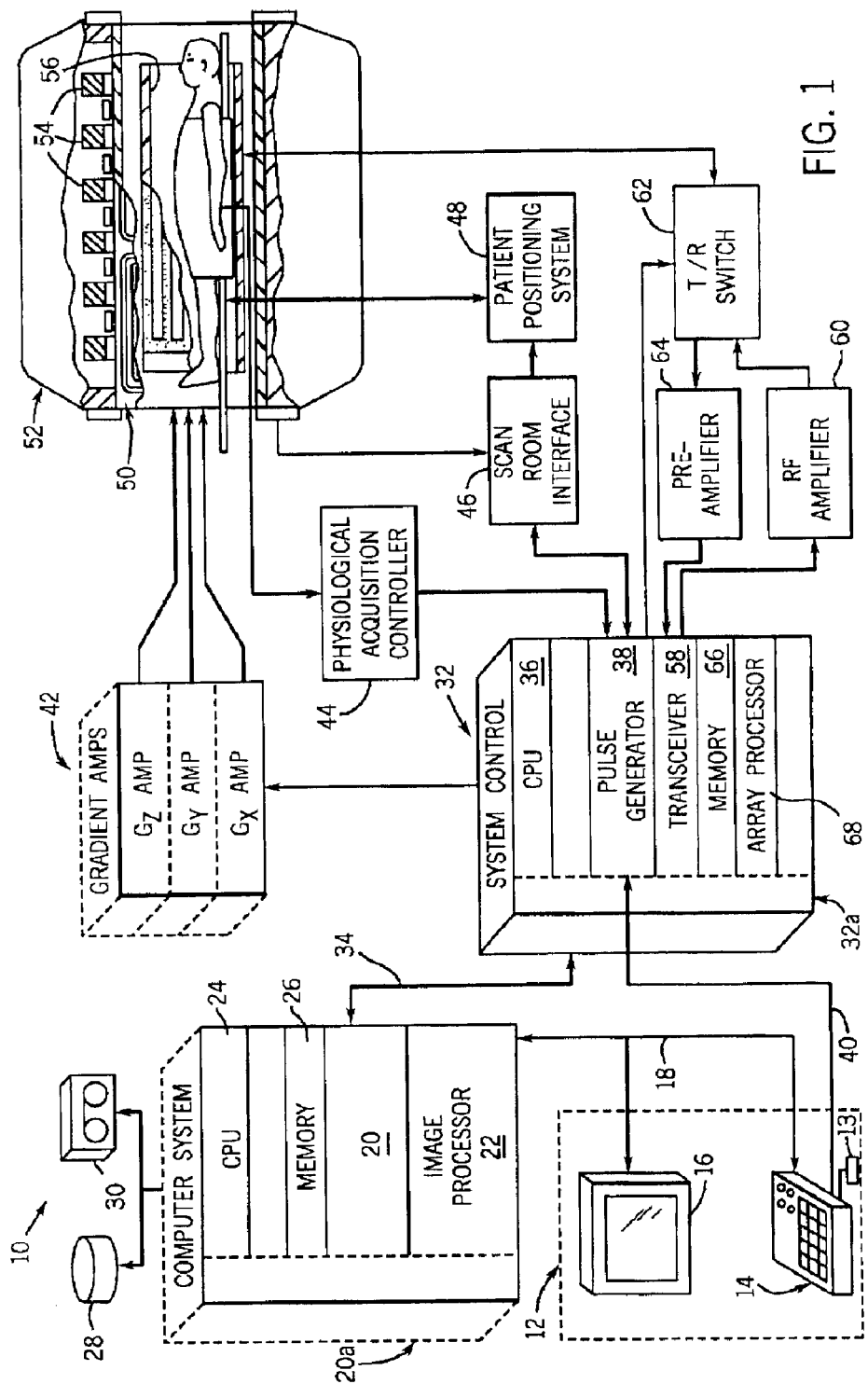
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66 As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images to acquire high-temporal resolution MR images that are not dependent on a patient breath-hold. The invention is particularly useful for cardiovascular MR exams.

The high temporal, free-breathing MR images of the present invention are acquired by periodically monitoring an ECG to measure heart rate while the MR scanner is idle such that there is no interference between the magnetic gradients of the MR scanner and the ECG acquisition. During an MR-based stress function examination, in accordance with the present invention, a patient is first subject to successively increasing levels of cardiac stress which leads to an increased heart rate. The stress can be induced by either physical exercise or the administration of a pharmaceutical, such as dobutamine. The heart rate is then monitored with an ECG, and once the heart rate has stabilized at a desired stress level, this examination method includes recording a time period of an R—R interval to estimate future R—R intervals for MR data acquisition. That is, in order to avoid interference in acquiring ECG signals for ECG gating that can be caused by the magnetic gradients when scanning, once the desired stress level is reached, and the time period of an R—R interval is recorded, no further heart rate monitoring is required and the MR data can be immediately acquired. This non-gated MR data acquisition is performed using the time period recorded to estimate the R—R interval and acquire data over each such interval regardless of an actual R—R interval start and end. In other words, this MR data acquisition is not gated to an ECG trigger, and is therefore not susceptible to the inaccuracies that can be caused by the significant distortion of the ECG waveform when the magnetic gradients are applied.

In accordance with the invention, k-space data acquisition is segmented across multiple R—R intervals. Preferably, the data acquisition is performed over a small number of R—R intervals where the heart rate can be assumed constant and breathing artifacts minimal. If there are n sets of MR data acquired, each frame of MR data acquired is partitioned, or segmented, and the pulse sequence partitions the raw data matrix (k-space) into n segments, and acquires each portion in successive R—R intervals. For example, in one embodiment where n=2, the upper and lower halves of the k-space data can be acquired in two successive heartbeats. Alternatively, using a modified echo-train trajectory, the even and odd numbered lines of the k-space matrix can be acquired in successive heartbeats. However, it is noted that any appropriate segmentation of k-space that minimizes phase and amplitude differences at the transition boundaries can be used.

Referring to FIG. 2, a convention real-time data acquisition scheme 100 is shown. In this example, 11 frames of data 102 are acquired in a single R—R interval 104. As a point of reference, each frame is acquired in a time T. As indicated by the position of frame 106, which starts the data acquisition 102, this acquisition is gated with the start of the R—R interval 108. However, the magnetic gradients from the previous data acquisition 110 may significantly distort the reading of ECG signals to signify the start of the R—R interval 108 such that it is oftentimes difficult to properly gate the data acquisition to the true, accurate R—R interval 104. In many cases, the actual acquisition occurs at some later point, but due to the distortion, is not known. Since the distortion of the ECG signal is not necessarily the same with each data acquisition, if the k-space data is segmented and then combined, the resulting reconstructed image has significant blurring.

Referring to FIG. 3, a real-time data acquisition scheme 120 in accordance with the present invention is shown in which an estimated R—R interval 122 is used for acquiring a set of data 124. Data is partitioned into n segments, where each segment is acquired in n successive R—R intervals. In one preferred embodiment, the acquisition time for acquiring each frame of data is T/2, and therefore twice as many frames can be acquired. However, to do so, data is partitioned into segments, where each segment is acquired in a successive R—R interval. In this manner, high temporal resolution images can be acquired even though the cardiac cycle is significantly reduced in length due to the high heart rate. In the example shown, 22 frames of data are fit within a single R—R interval to allow greater visualization of the systolic phase and provide greater spatial resolution to detect wall motion abnormalities without requiring breath-holding by the patient. During each estimated R—R interval 122, a portion of the k-space data is acquired for each frame 126. As indicated by frame 128 within the set of MR data 124, a first portion of the k-space is acquired, and in a second set of MR data 130, a second portion of the k-space is acquired as indicated in frame 132. In order to reconstruct the image, like-spaced frames in the estimated R—R interval 122 are combined with the successively acquired frames. For example, by combining frame 128 and frame 132, a higher resolution image 134 can be obtained. In one embodiment, one-half of k-space image data can be acquired in each given segment where n=2, or one-third where n=3, and so on. Alternately, even and odd numbered lines of k-space data can be acquired in successive R—R intervals.

Figure 4:
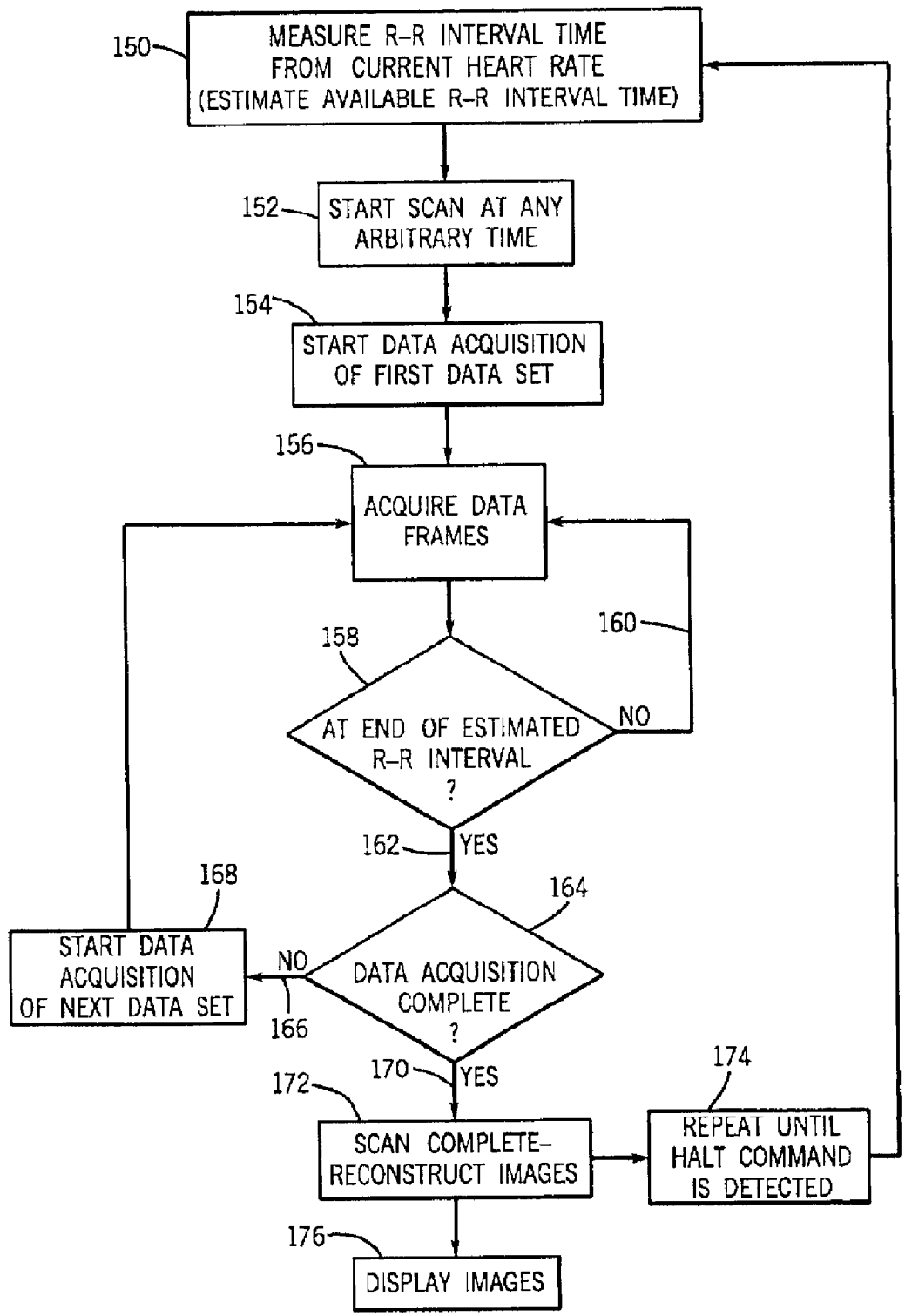
FIG. 4 is a flow chart of the technique of the present invention.

Referring to FIG. 4, a flow chart for acquiring high temporal resolution images in near real-time is shown. After monitoring the heart rate of a patient just prior to image acquisition, an R—R interval time is measured to acquire a time period from the current heart rate to estimate available R—R interval time 150, as previously described. That time period is then recorded, or stored in memory, to prospectively estimate the future R—R intervals. ECG monitoring can then stop, and the MR scanning can begin at an arbitrary time point in the R—R interval 152. The acquisition of the first data set can then begin at 154 by acquiring each individual data frame 156. An internal clock then monitors the time period for acquiring the data frames and continues to acquire data frames until the end of the estimated R—R interval 158, 160. At the end of the estimated R—R interval 158, 162, the system checks to see whether all data sets have been acquired 164, and if an additional data set is to be acquired 166, acquisition of a successive data set begins at 168, and continues until the end of the next estimated R—R interval 158, 162. Once all data has been acquired 164, 170 the scan is complete and the images can be reconstructed at 172. If additional scans are desired 174, the aforementioned algorithm is repeated. If not, the images are displayed at 176 to complete an examination.

Accordingly, the present invention includes a method of performing an examination which includes subjecting a patient to successively increasing levels of cardiac stress while monitoring the heart rate of the patient. Once the heart rate is stabilized at a desired stress level, the examination method includes recording a time period of an R—R interval, and then acquiring non-gated MR data using the time period recorded to an estimate R—R interval. The step of acquiring MR data can include acquiring segments of each frame of data over successive R—R intervals. In this case, the system includes combining the segments of each frame to reconstruct an image with high temporal resolution without requiring patient breath-holding.

The invention includes a computer program for use with an MRI scanner that has a computer, such as a configuration described with reference to FIG. 1, wherein the computer program has a set of instructions that, when executed, causes the computer to receive a time period signal indicative of an R—R interval representing a cardiac cycle of a patient, and then to acquire a first set of partial MR image data during a first acquisition period equal to the R—R interval. The computer program then causes the computer to acquire a second set of partial MR image data during a second acquisition period, also equal to the R—R interval. The computer program has instructions to reconstruct an MR image by combining the first set of partial MR image data with the second set of partial MR image data. As one skilled in the art will readily recognize, this aspect of the invention is not limited to acquiring two sets of partial MR image data, and may be extended to third, fourth, fifth, and so on, partial MR image data sets. In general, the computer program is designed to acquire n sets of partial MR image data, where each frame of data in a partial MR data set is acquired at a similar time of a corresponding frame of data in each of the partial MR data sets during an R—R interval.

The acquisition of MR data with such a system is advantageous as it is not gated to an ECG trigger signal and each set of partial MR data is acquired at a time irrespective of the start or end of an R—R interval. The k-space data can be segmented in any number of ways, two examples of which include either acquiring one-half of the k-space data for a given segment where n=2, or acquiring even and odd numbered lines of k-space data in successive R—R intervals. The invention can be extended such that the computer program can cause the computer to monitor heart rate and generate an R—R time period indicative of a current R—R interval in a patient while the MR scanner is idle. The program periodically monitors heart rate and generates an R—R time period after the acquisition of MR data is complete. It is therefore not necessary to acquire ECG signals while the MR scanner creates the magnetic gradients that can interfere with the ECG waveform.

An MRI apparatus is disclosed to acquire high temporal resolution images that includes an MRI system having a computer, such as that disclosed with reference to FIG. 1. The computer is programmed to monitor heart rate of a patient, acquire a time period of an R—R interval of the heart rate, and to store the time period of the R—R interval. The computer is also programmed to enable the MRI system and begin an MR scan of the patient at an arbitrary time in the R—R interval. MR data is acquired for a time comparable to the time period stored. The computer then reconstructs an MR image with the MR data acquired over an R—R interval as estimated by the time period. The computer can be further programmed to segment data acquisition such that a portion of data is acquired during each acquisition and then combined to reconstruct an MR image with higher resolution. In general, the computer is programmed to acquire n sets of MR data, each having m frames, where each frame is segmented into n segments and the m frames fit within one R—R interval.

In a preferred embodiment, the computer is programmed to apply a fast gradient-recalled echo pulse sequence or a steady state free precession pulse sequence, which are two examples of pulse sequences that allow significantly reduced imaging scan times by permitting the collection of multiple k-space lines from each RF excitation. One skilled in the art will readily recognize that other pulse sequences that allow the collection of segmenting k-space data are equally applicable.

Since no physiological triggering is required with the present invention, the pulse sequence need not be synchronized to the starting phase of the cardiac contraction cycle. As previously described, the pulse sequence used employs a segmented k-space echo-train data acquisition scheme. Since the data is partitioned into n segments, the temporal resolution is n times that obtained using MR fluoroscopy for the same spatial resolution. For example, if the number of heart beats for an acquisition is n, the sequence repetition time is TR, the echo train length is ETL, and the total number of lines in the data matrix is YRES, then the temporal resolution of the sequence can be found by dividing the views per segment (VSP) by the echo train length (ETL) and multiplying the result by the sequence repetition time (TR) as follows:

$$(VPS/ETL) \times TR \quad (Eqn. 1);$$

where VPS is the total number of lines in the data matrix divided by n. Therefore, the temporal resolution of the sequence can be given as:

$$(YRES \times TR)/(ETL \times n) \quad (Eqn. 2).$$

Using typical parameters such as an echo train length (ETL) of eight, an image matrix of 128×96 with phase FOV equal to 0.5 such that the total number of lines in the data matrix (YRES) is 48 and a sequence repetition time (TR) of 11 ms., the temporal resolution achievable for n=2 is 33 ms. For n=4, the temporal resolution is 16.5 ms. Such values for temporal resolution are adequate for heart rates up to 180 pbm for n=2, and even higher for larger n values. MR fluoroscopy can be treated as a special case with n=1, resulting in a temporal resolution of 66 ms.

The present invention has been described in terms of the preferred embodiment, and it is recognized that equivalents, alternatives, and modifications, aside from those expressly stated, are possible and within the scope of the appending claims.

What is claimed is:

1. A method of acquiring free-breathing MR images comprising the steps of:
    monitoring heart rate of a subject just prior to image acquisition to acquire a time period of an R—R interval;
    recording the time period from the heart rate monitoring to prospectively estimate future R—R intervals; and
    acquiring n sets of MR data, a first MR data acquisition commencing at any point in an R—R interval and extending for the time period recorded.

2. The method of claim 1 further comprising the steps of segmenting each MR data acquisition into n segments and repetitively acquiring each segment in n successive heartbeats.

3. The method of claim 2 further comprising the step of combining the n MR data sets to form a set of MR images with high temporal resolution covering the R—R interval.

4. The method of claim 1 further comprising the step of discontinuing heart rate monitoring before acquiring MR image data.

5. The method of claim 1 wherein a second set of MR data is acquired immediately after the acquisition of the first set of MR data.

6. The method of claim 2 wherein n=1 for fluoroscopy imaging.

7. The method of claim 1 wherein the step of acquiring MR data is performed using one of a fast gradient-recalled echo pulse sequence and a steady state free precession pulse sequence.

8. The method of claim 1 further comprising the steps of:
    subjecting a patient to successively increased, graded levels of cardiac stress during the monitoring step until the heart rate is stabilized at a required stress level; and
    acquiring MR data according to the acquisition step of several long and short axis views of at least a portion of a heart muscle to monitor cardiac function during any portion of a stress test.

9. The method of claim 8 wherein the cardiac stress is induced either by physical stress or administration of a pharmaceutical.

10. A computer readable storage medium having a computer program stored thereon for use with an MRI scanner having a computer, the computer program representing a set of instruction that, when executed, causes the computer to:
    receive a time-period signal indicative of an R—R interval representing a cardiac cycle of a patient;
    acquire a first set of partial MR image data during a first acquisition period equal to the R—R interval;
    acquire a second set of partial MR image data during a second acquisition period equal to the R—R interval; and
    reconstruct an MR image by combining the first set of partial MR image data with the second set of partial MR image data.

11. The computer readable storage medium of claim 10 wherein the set of instructions further causes the computer to acquire n sets of partial MR image data, each frame of data in a partial MR data set being acquired at a similar time of a corresponding frame of data in each partial MR data set during the R—R interval.

12. The computer readable storage medium of claim 10 wherein the acquisition of MR data is not gated to an ECG trigger.

13. The computer readable storage medium of claim 10 wherein the acquisition of each set of partial MR data is acquired at a time irrespective of either one of an R—R interval start and end.

14. The computer readable storage medium of claim 10 wherein each portion of MR data is a segment of an MR data set.

15. The computer readable storage medium of claim 10 wherein one-half of k-space image data for a given segment is acquired during each R—R time period.

16. The computer readable storage medium of claim 10 wherein even and odd numbered lines of a k-space matrix are acquired in successive R—R intervals.

17. The computer readable storage medium of claim 10 wherein the set of instructions further causes the computer to monitor heart rate and generate an R—R time period indicative of a current R—R interval in a patient while the MR scanner is idle.

18. The computer readable storage medium of claim 10 wherein the set of instructions further causes the computer to periodically monitor heart rate and generate an R—R time period before and after each acquisition of MR data and not during any acquisition of MR data.

19. An MRI apparatus to acquire high-temporal resolution images comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
  monitor heart rate of a patient;
  acquire a time period of an R—R interval of the heart rate;
  store the time period of the R—R interval;
  enable the MRI system and begin an MR scan of the patient at an arbitrary time in the R—R interval;
  continue to acquire MR data for a time comparable to the time period stored; and
  reconstruct an MR image with the MR data acquired over at least one R—R interval as estimated by the time period stored.

20. The MRI apparatus of claim 19 wherein the computer is further programmed to:
  segment data acquisition such that a portion of data is acquired during each acquisition; and
  combine the segmented data acquired to reconstruct the MR image.

21. The MRI apparatus of claim 19 wherein the computer is further programmed to acquire n sets of MR data, each having m frames, where each frame is segmented into n segments and the m frames fit within one R—R interval.

22. The MRI apparatus of claim 19 wherein the computer is further programmed to apply one of a fast gradient-recalled echo pulse sequence and a steady state free precession pulse sequence.

23. The MRI apparatus of claim 19 wherein the computer is further programmed to acquire one-half of k-space image data for a given segment during each R—R time period.

24. The MRI apparatus of claim 19 wherein the computer is further programmed to acquire even and odd numbered lines of a k-space matrix in successive R—R intervals.

25. An examination method comprising the steps of:
  subjecting a patient to successively increasing levels of cardiac stress;
  monitoring heart rate;
  once the heart rate is stabilized at a desired stress level, recording a time period of an R—R interval;
  acquiring non-gated MR data using the time period recorded to estimate R—R intervals.

26. The examination method of claim 25 wherein the cardiac stress is induced by one of either physical exercise or administration of a pharmaceutical.

27. The examination method of claim 25 wherein the step of acquiring MR data includes acquiring segments of each frame of data over successive R—R intervals.

28. The examination method of claim 25 further comprising the step of combining the segments for each frame to reconstruct an image with high-temporal resolution without requiring patient breath-holding.

29. The examination method of claim 25 where a fraction of total k-space is acquired during each cardiac R—R interval.

30. The examination method of claim 29 where the step of acquiring MR data includes acquiring segments of each frame of data over successive n R—R intervals in order to complete data acquisition for a CINE data set.

31. The examination method of claim 30 further comprising repeating the acquisition to provide an updated CINE data set every n R—R intervals.

32. The examination method of claim 31 further comprising displaying continuous cardiac wall motion activity in order for an operator to monitor cardiac wall motion in real-time.

* * * * *

US006889071C1

(12) EX PARTE REEXAMINATION CERTIFICATE (5858th)
United States Patent
Saranathan et al.

(10) Number: US 6,889,071 C1
(45) Certificate Issued: Aug. 14, 2007

(54) ACQUISITION OF HIGH-TEMPORAL FREE-BREATHING MR IMAGES

(75) Inventors: Manojkumar Saranathan, Rockville, MD (US); Thomas K. F. Foo, Rockville, MD (US); J. Andrew Derbyshire, Baltimore, MD (US)

(73) Assignee: General Electric Company, Schenectady, NY (US)

Reexamination Request:
No. 90/007,977, Mar. 20, 2006

Reexamination Certificate for:
Patent No.: 6,889,071
Issued: May 3, 2005
Appl. No.: 09/681,068
Filed: Dec. 19, 2000

(51) Int. Cl.
*A61B 5/05* (2006.01)

(52) U.S. Cl. ........................................ 600/413; 600/410
(58) Field of Classification Search .................. None
See application file for complete search history.

(56) References Cited

PUBLICATIONS

Lenz, G. et al, Retrospective Cardiac Gating: A Review of Technical Aspects and Future Directions, Magnetic Resonance Imaging, vol. 7, pp. 445–455 (1989).*
E. Mark Haacke et al., "Pseudo–gating: Elimination of Periodic Motion Artifacts in Magnetic Resonance Imaging Without Gating," *Magnetic Resonance in Medicine 4*, 162–174 (1987), Academic Press, Inc.

* cited by examiner

*Primary Examiner*—Beverly M. Flanagan

(57) ABSTRACT

A system and method are disclosed to acquire high temporal resolution free-breathing cardiac MR images. The technique includes monitoring heart rate of a patient just prior to image acquisition to acquire a time period of an R—R interval, and using this time period from the heart rate monitoring to prospectively estimate future R—R intervals. The acquisition of MR data can then commence at any point in an R—R interval and extend for the time period recorded. The data acquisition can be segmented and acquired in successive R—R intervals, then combined to create high temporal resolution images.

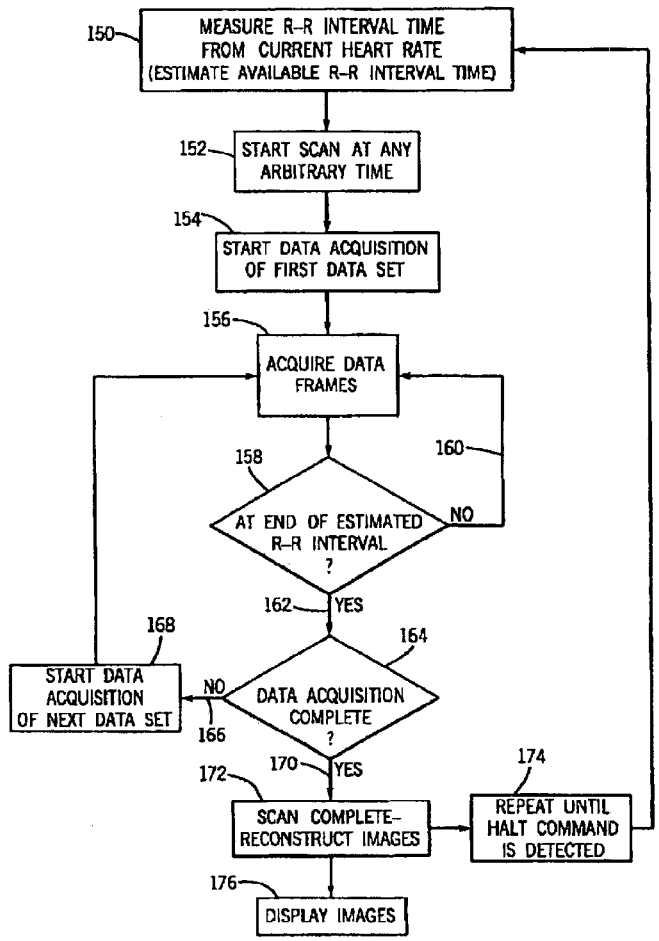

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–32 is confirmed.

* * * * *